United States Patent
Ochiai

(10) Patent No.: US 7,835,264 B2
(45) Date of Patent: *Nov. 16, 2010

(54) INTERLEAVER, DEINTERLEAVER, COMMUNICATION DEVICE, AND METHOD FOR INTERLEAVING AND DEINTERLEAVING

(75) Inventor: Mari Ochiai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/826,158

(22) Filed: Jul. 12, 2007

(65) Prior Publication Data

US 2007/0274318 A1    Nov. 29, 2007

Related U.S. Application Data

(62) Division of application No. 11/023,963, filed on Dec. 29, 2004.

(51) Int. Cl.
  *H04J 11/00* (2006.01)
  *H04B 7/02* (2006.01)
  *H04J 3/00* (2006.01)

(52) U.S. Cl. .............. 370/208; 370/204; 370/319; 370/343; 370/476; 375/267; 375/296; 375/347; 455/504; 455/506; 455/466

(58) Field of Classification Search ......... 370/203–479; 709/235, 238, 245; 375/267, 296, 347; 455/466–506
See application file for complete search history.

(56) References Cited

U.S. PATENT DOCUMENTS

| 5,799,033 | A | * | 8/1998 | Baggen ............... 375/250 |
| 5,809,067 | A | * | 9/1998 | Funk et al. .......... 375/222 |
| 5,966,401 | A | | 10/1999 | Kumar |
| 6,128,276 | A | | 10/2000 | Agee |
| 6,272,123 | B1 | * | 8/2001 | Abe ................... 370/342 |
| 6,307,868 | B1 | * | 10/2001 | Rakib et al. ......... 370/485 |
| 6,333,926 | B1 | * | 12/2001 | Van Heeswyk et al. ... 370/335 |
| 6,356,528 | B1 | * | 3/2002 | Lundby et al. ....... 370/209 |
| 6,377,566 | B1 | | 4/2002 | Cupo et al. |
| 6,452,981 | B1 | * | 9/2002 | Raleigh et al. ....... 375/299 |
| 6,480,976 | B1 | * | 11/2002 | Pan et al. ............ 714/701 |
| 6,493,331 | B1 | * | 12/2002 | Walton et al. ........ 370/341 |
| 6,662,024 | B2 | * | 12/2003 | Walton et al. ....... 455/562.1 |

(Continued)

OTHER PUBLICATIONS

Sellathurai, et al.; "TURBO-BLAST for Wireless Communications: Theory and Experiments", IEEE Transactions on Signal Processing, vol. 50, No. 10, Oct. 2002; pp. 2538-2546.

(Continued)

*Primary Examiner*—Ayaz R Sheikh
*Assistant Examiner*—Venkatesh Haliyur
(74) *Attorney, Agent, or Firm*—Birch, Stewart, Kolasch & Birch, LLP.

(57) ABSTRACT

A communication device carries out communication using N number of communication channels, where N is an integer not less than 2. The communication device includes interleavers that shuffle a data series, which is meant to be transmitted over the N number of communication channels, in at least two directions from among a time direction, a space direction, and a frequency direction, and deinterleavers that shuffle the data series back to obtain the original data series.

2 Claims, 8 Drawing Sheets

U.S. PATENT DOCUMENTS

| | | | |
|---|---|---|---|
| 6,665,308 B1* | 12/2003 | Rakib et al. | 370/441 |
| 6,678,263 B1* | 1/2004 | Hammons et al. | 370/342 |
| 6,744,743 B2* | 6/2004 | Walton et al. | 370/318 |
| 6,807,145 B1* | 10/2004 | Weerackody et al. | 370/203 |
| 6,831,574 B1* | 12/2004 | Mills et al. | 341/50 |
| 6,831,943 B1 | 12/2004 | Dabak et al. | |
| 6,856,610 B2 | 2/2005 | Schmidl et al. | |
| 6,937,617 B2* | 8/2005 | Rakib et al. | 370/485 |
| 6,961,388 B2* | 11/2005 | Ling et al. | 375/267 |
| 6,971,057 B1* | 11/2005 | Delvaux et al. | 714/788 |
| 6,977,974 B1* | 12/2005 | Geraniotis et al. | 375/340 |
| 6,981,203 B2* | 12/2005 | Mills | 714/794 |
| 7,002,900 B2* | 2/2006 | Walton et al. | 370/208 |
| 7,012,882 B2* | 3/2006 | Wang et al. | 370/208 |
| 7,020,165 B2* | 3/2006 | Rakib et al. | 370/485 |
| 7,031,344 B2* | 4/2006 | Rakib et al. | 370/479 |
| 7,039,846 B2* | 5/2006 | Hewitt et al. | 714/755 |
| 7,054,296 B1* | 5/2006 | Sorrells et al. | 370/338 |
| 7,085,987 B2* | 8/2006 | Hewitt et al. | 714/755 |
| 7,095,707 B2* | 8/2006 | Rakib et al. | 370/204 |
| 7,158,498 B2* | 1/2007 | Lundby et al. | 370/335 |
| 7,159,163 B2* | 1/2007 | Lundby | 714/749 |
| 7,218,604 B2 | 5/2007 | Hosur et al. | |
| 7,218,665 B2* | 5/2007 | McElwain | 375/143 |
| 7,239,650 B2* | 7/2007 | Rakib et al. | 370/480 |
| 7,248,879 B1* | 7/2007 | Walton et al. | 455/452.2 |
| 7,324,482 B2 | 1/2008 | Hammons, Jr. et al. | |
| 7,436,896 B2* | 10/2008 | Hottinen et al. | 375/267 |
| 2002/0108083 A1* | 8/2002 | Matsumoto | 714/755 |
| 2002/0157060 A1 | 10/2002 | Baeken et al. | |
| 2002/0168033 A1* | 11/2002 | Suzuki et al. | 375/341 |
| 2002/0196842 A1* | 12/2002 | Onggosanusi et al. | 375/148 |
| 2003/0014709 A1* | 1/2003 | Miyoshi et al. | 714/758 |
| 2003/0026349 A1* | 2/2003 | Onggosanusi et al. | 375/267 |
| 2003/0123425 A1* | 7/2003 | Walton et al. | 370/341 |
| 2003/0123563 A1 | 7/2003 | Lu | |
| 2003/0131304 A1* | 7/2003 | Li | 714/755 |
| 2004/0002364 A1* | 1/2004 | Trikkonen et al. | 455/562.1 |
| 2004/0081073 A1* | 4/2004 | Walton et al. | 370/204 |
| 2004/0117716 A1 | 6/2004 | Shen | |
| 2004/0146014 A1 | 7/2004 | Hammon, Jr. et al. | |
| 2004/0160892 A1 | 8/2004 | Agrawalla et al. | |
| 2005/0041746 A1* | 2/2005 | Rosen et al. | 375/242 |
| 2005/0078761 A1* | 4/2005 | Hottinen et al. | 375/267 |
| 2005/0084031 A1* | 4/2005 | Rosen et al. | 375/295 |
| 2005/0084032 A1* | 4/2005 | Rosen et al. | 375/295 |
| 2005/0084033 A1* | 4/2005 | Rosen et al. | 375/295 |
| 2005/0100076 A1* | 5/2005 | Gazdzinski et al. | 375/130 |
| 2005/0100102 A1* | 5/2005 | Gazdzinski et al. | 375/242 |
| 2006/0039275 A1* | 2/2006 | Walton et al. | 370/208 |
| 2007/0258391 A1* | 11/2007 | Ochiai | 370/295 |
| 2007/0274318 A1* | 11/2007 | Ochiai | 370/394 |
| 2008/0095121 A1* | 4/2008 | Shattil | 370/335 |
| 2008/0144733 A1* | 6/2008 | ElGamal et al. | 375/267 |

OTHER PUBLICATIONS

"High-Speed Physical Layer in the 5GHz Band", IEEE Std 802.11a-1999; Supplement to IEEE Standard for Information Technology; pp. 17-19 (1999).

Chen, et al.; "A 3-Dimensional Joint Interleaver for 802.11n MIMO Systems"; IEEE 802.11-04/1026r0; Sep. 2004.

* cited by examiner

INTERLEAVING UNIT 12-1: 1, 25, 49, 1, 25, 52, 4, 28, 55, 4, 28, 58, 7, 31, 61, 7, 31, 64, ...
INTERLEAVING UNIT 12-2: 2, 14, 26, 38, 50, 74, 2, 14, 26, 38, 50, 74, 2, 14, 26, 38, 51, 75, 3, 15, 27, 39, 53, 77, 3, 15, 27, 39, ...

BPSK

QPSK

INTERLEAVER, DEINTERLEAVER, COMMUNICATION DEVICE, AND METHOD FOR INTERLEAVING AND DEINTERLEAVING

This application is a Divisional of Prior application Ser. No. 11/023,963 filed Dec. 29, 2004 and claim benefit of the application under 35 U.S.C. §120.

BACKGROUND OF THE INVENTION

1) Field of the Invention

The present invention relates to an interleaver and a deinterleaver that respectively shuffle data and restore the order of data in a communication system. More particularly, the present invention relates to an interleaver, a deinterleaver, a communication device, and a method for trans-communication channel interleaving and deinterleaving, by which data can be sorted across a plurality of communication channels.

2) Description of the Related Art

A communication device deployed in a conventional communication system is explained first. Error bursts due to fading are common in communication systems like wireless LAN802.11 or HISWAN, etc. To counter the error bursts, these communication systems perform bit interleaving on the data that is subjected to an error correction coding. To be specific, an interleaver at the transmitter end shuffles the order of the data that is subjected to error correction coding, while a deinterleaver at the receiver end restores the original order of the data. The processes of interleaving and deinterleaving randomize the occurrence of burst errors and reduce data error.

A conventional communication system stipulated by the wireless LAN standards 802.11a set down by the United States (see Institute of Electrical and Electronic Engineers (IEEE) Standards 802.11a-1999) is explained next. The transmitter at the transmitting end subjects the information data to error correction coding, and shuffles the order of the data (conventional method of interleaving). The transmitter further modulates the shuffled data by a predetermined modulation method, and transmits the data. At the receiver end, the modulated data is demodulated, and the original order of the data is restored, after which the data is decoded.

However, the communication device in the conventional communication system has the following problems.

FIG. 8A and FIG. 8B are drawings illustrating an interleaving method deployed in the conventional communication system. Specifically, FIG. 8A represents a Binary Phase Shift Keying (BPSK) interleaver that shuffles data by writing horizontally and reading vertically. FIG. 8B represents a Quadrature Phase Shift Keying (QPSK) interleaver, which also shuffles data like the BPSK interleaver, that is, by writing horizontally and reading vertically. The size and the shape of the interleaver created are specific to the modulation method, and closing of the interleaving process is independent of the communication channel.

However, in a communication involving a plurality of communication channels, if the interleavers are closed independently in all the communication channels as in the conventional communication system, deterioration in communication conditions in one of the communication channels (that is, if one of the communication channels is affected by interference, etc.) leads to a significant reduction in the throughput.

SUMMARY OF THE INVENTION

It is an object of the present invention to at least solve the problem described above, and to provide an interleaver, an deinterleaver corresponding to the interleaver, and a communication device that includes the interleaver and the deinterleaver that shuffle data across a plurality of communication channels, and maintain a high throughput by averaging out the communication conditions of each of the communication channels.

To solve the above problem, and to achieve the objective mentioned above, an interleaver provided in a communication device that carries out communication using N number of communication channels, where N is greater than 2, includes a trans-communication channel interleaving unit that shuffles a data series to be transmitted to the N number of communication channels, in at least two directions from among a time direction, a space-division communication channel direction, and a frequency-division communication channel direction.

According to the present invention, a data series in the form of an output of a single error correcting encoder is transmitted by distributing the output to a plurality of frequency-division communication channels. Consequently, even if one communication channel is unable to communicate independently due to a sudden major interference, or the like, the errors are widely scattered due to the trans-communication channel interleaving, and therefore, error correction can be carried out.

According to the present invention, a data series meant for transmission is transmitted to a plurality of frequency-division communication channels. Consequently, even if one communication channel is unable to communicate independently due to a sudden major interference, or the like, the errors are widely scattered due to the trans-communication channel interleaving and deinterleaving. As a result, error correction can be carried out, and throughput is not adversely affected.

The other objects, features, and advantages of the present invention are specifically set forth in or will become apparent from the following detailed description of the invention when read in conjunction with the accompanying drawings.

DETAILED DESCRIPTION

Exemplary embodiments of the interleaver, the deinterleaver, the communication device, and the method of interleaving and deinterleaving according to the present invention are explained next with reference to the accompanying drawings. The present invention is not limited to the embodiments described herein.

First Embodiment

Figure 1A:
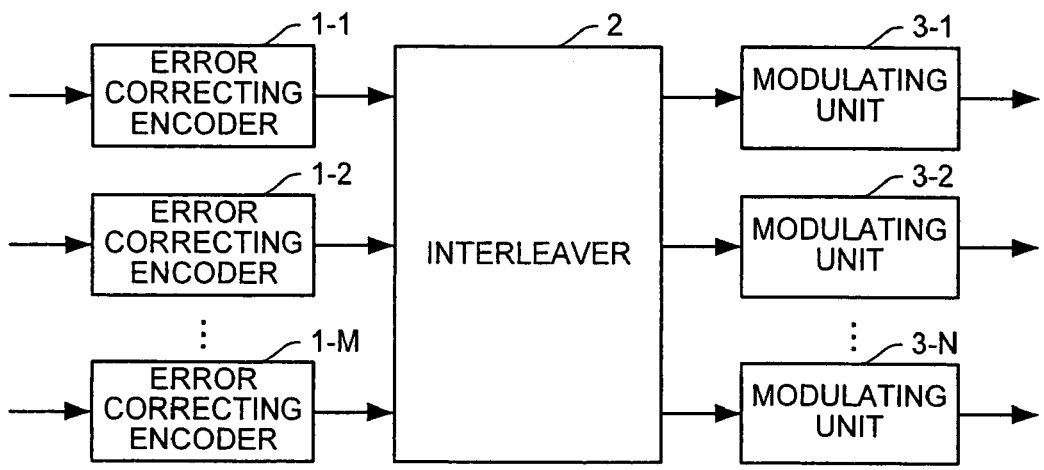
FIG. 1A and FIG. 1B are drawings of a communication device in which an interleaver and a deinterleaver according to the present invention are deployed.
Figure 1B:
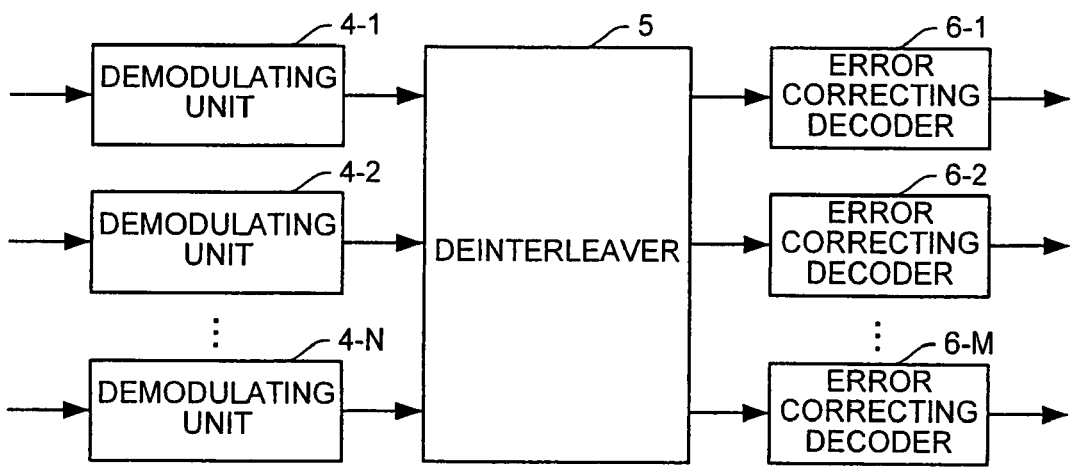

FIG. 1A and FIG. 1B are drawings of a communication device in which the interleaver and the deinterleaver according to the present invention are deployed. To be more specific, FIG. 1A is a drawing of the communication device at a transmitter end, and FIG. 1B is a drawing of the communication device at a receiver end.

The communication device according to the present embodiment is assumed to have N number of frequency-division communication channels. The transmitter end communication device shown in FIG. 1A includes M number of error correcting encoders 1-1 through 1-M, an interleaver 2 that shuffles the data meant for different communication channels, and N number of modulating units 3-1 through 3-N. The receiver end communication device shown in FIG. 1B includes N number of demodulating units 4-1 through 4-N, a deinterleaver 5 that shuffles the data meant for different communication channels, and M number of error correcting decoders 6-1 through 6-M.

The error correcting encoders 1-1 through 1-M perform a predetermined encoding process on the data meant for transmission (transmission data). The interleaver 2 shuffles the outputs from M number of error correcting encoders 1-1 to 1-M (that is, performs interleaving between the outputs from the plural error correcting encoder). Each of the modulating units 3-1 through 3-N modulates the shuffled transmission data by a predetermined modulation method assigned to the relevant communication channel, and outputs the modulated transmission data. Each of the demodulating units 4-1 through 4-N of the receiver end transmission device demodulates the receiver signal of the relevant communication channel. The deinterleaver 5 shuffles the data back to the original order of the data (that is, restores the order of the data) shuffled by the interleaver 2. Each of the error correcting decoders 6-1 through 6-M decodes the original transmission data by a decoding method corresponding to the relevant error correcting encoders 1-1 through 1-M.

Figure 2A:
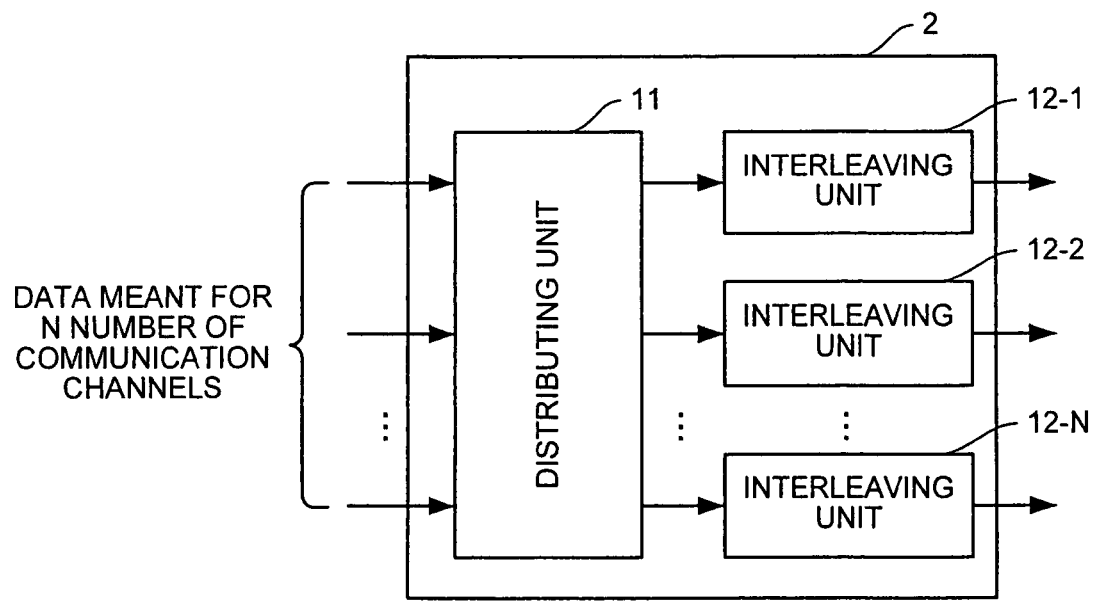
FIG. 2A and FIG. 2B are drawings of configurations of the interleaver and deinterleaver.
Figure 2B:
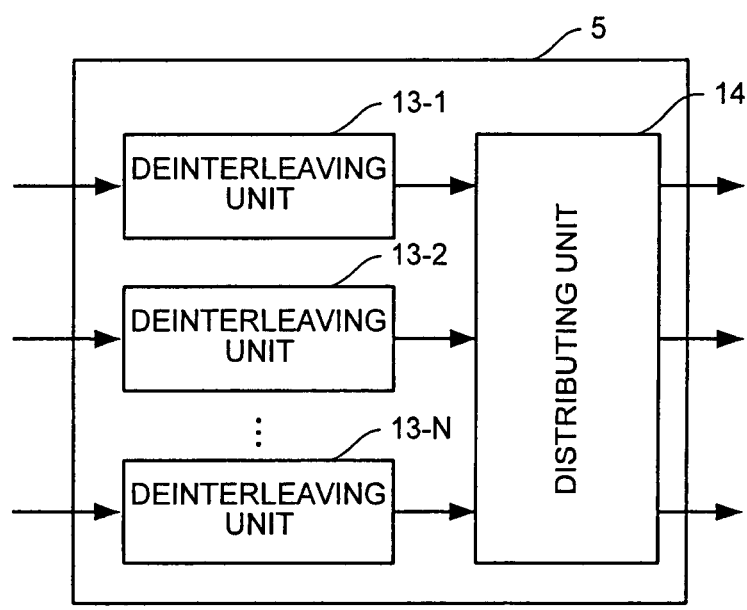

FIG. 2A is a drawing of a configuration of the interleaver according to the present invention, and FIG. 2B is a drawing of a configuration of the deinterleaver according to the present invention. The interleaver according to the present invention includes a distributing unit 11, and N number of interleaving units 12-1 through 12-N. The deinterleaver according to the present invention includes N number of deinterleaving units 13-1 through 13-N, and a distributing unit 14.

The distributing unit 11 distributes the outputs from M number of error correcting encoders 1-1 through 1-M among N number of interleaving units 12-1 through 12-N. The distributing unit 11 distributes, by a predetermined distribution method, the outputs from M number of error correcting encoders to each interleaving unit. The N number of deinterleaving units 13-1 through 13-N shuffle the data back to restore its original order. The distributing unit 14 has an action that is the reverse of the distributing unit 11, that is, distributes outputs from the N number of deinterleaving units 13-1 through 13-N among M number of error correcting decoders 6-1 through 6-M.

Figure 3A:
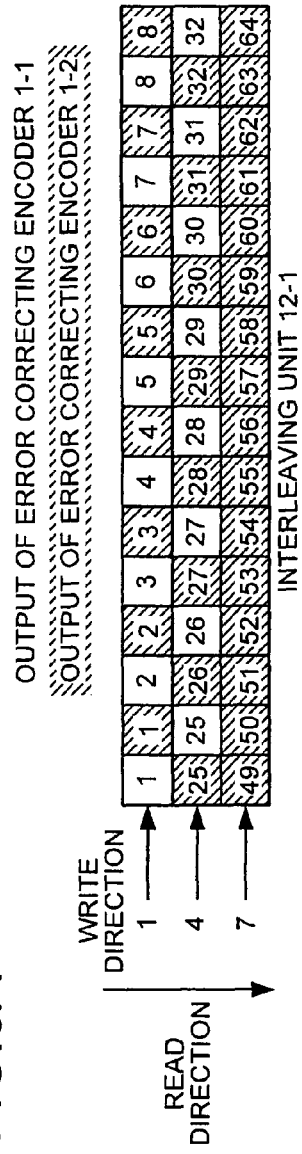
FIG. 3A and FIG. 3B are drawings illustrating an example of a shuffling method.
Figure 3B:
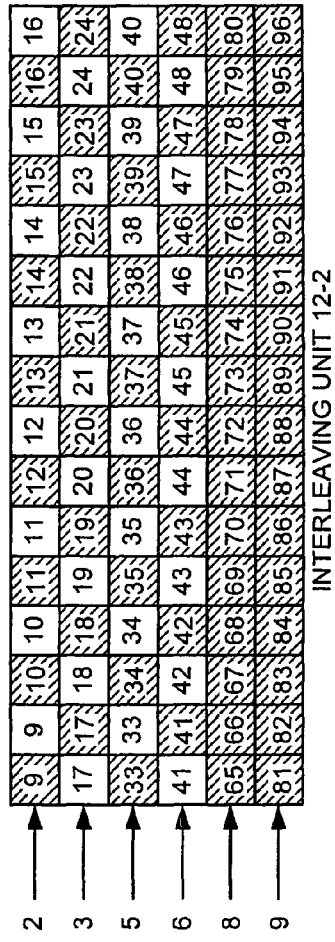

FIG. 3A and FIG. 3B are drawings illustrating an example of a shuffling method according to the present embodiment. To be more specific, FIG. 3A is a drawing illustrating a process of writing to the interleaving units when M=2 and N=2. FIG. 3B is a drawing illustrating the outputs of the interleaving units.

Figure 8A:
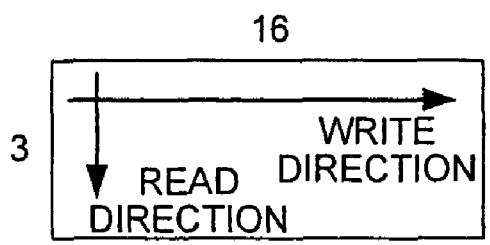
FIG. 8A and FIG. 8B are drawings illustrating an interleaving method deployed in a conventional communication system.
Figure 8B:
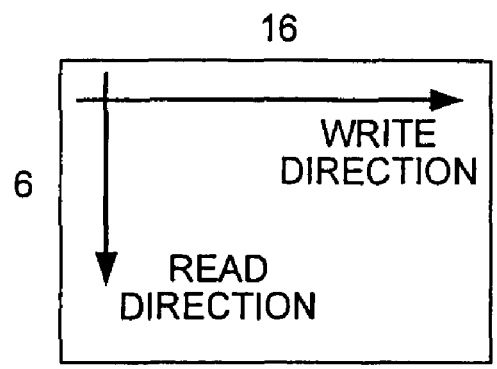

It is assumed that a first communication channel corresponding to the interleaving unit 12-1 employs BPSK as the modulation method, and a second communication channel corresponding to the interleaving unit 12-2 employs QPSK as the modulation method, and that both the interleaving units 12-1 and 12-2 conform to the Wireless LAN Standard 802.11a. In other words, the interleaving unit 12-1 is assumed to employ the modulation method shown in FIG. 8A, and the interleaving unit 12-2 is assumed to employ the modulation method shown in FIG. 8B. The interleaving units that conform to standards or systems other than Wireless LAN 802.11a may also be used. In the example, both M and N are taken as 2. However, M may be any number equal to or more than 1, and N may be any number equal to or greater than 2, and if these conditions are fulfilled, M may be equal to, less than or greater than N. The modulation method of the communication channel is not limited to BPSK and QPSK, and may be any multiple value modulation.

The non-shaded numbers in FIG. 3A represent the output (for instance, bits) of the error correcting encoder 1-1, and the shaded numbers represent the output of the error correcting encoder 1-2. It is assumed in this example that the number of symbols transmitted by the first communication channel and the second communication channel is the same. However, because twice as much data can be sent by QPSK as by BPSK, the output of the interleaving unit 12-2 is twice that of the interleaving unit 12-1.

In the distributing unit 11, the outputs from the error correcting encoders 1-1 and 1-2 are written alternately starting from the rows, with the write numbers corresponding to the interleaving unit 12-1 (row with the write number 1) and the interleaving unit 12-2 (row with the write number 2) in the sequence of the write numbers (1 through 9). In this way, one-third of the output of the error correcting encoders 1-1 and 1-2 is written to the interleaving unit 12-1, and the remaining two-thirds is written to the interleaving unit 12-2. Because the outputs from the interleaving units 12-1 and 12-2 are read column-by-column, an intermingled output of the error correcting encoder 1-1 and the output of the error correcting encoder 1-2 emerge as the outputs from the interleaving units 12-1 and 12-2, as shown in FIG. 3B.

Figures 4A, 4B:
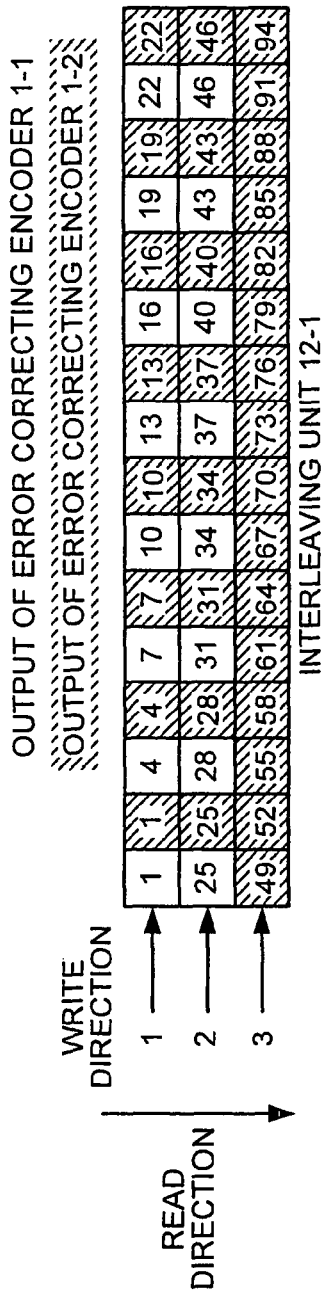
FIG. 4A and FIG. 4B are drawings illustrating another example of the shuffling method.

FIGS. 4A and 4B are drawings illustrating another example of the shuffling method according to the present embodiment. To be more specific, FIG. 4A is a drawing illustrating a process of writing to the interleaving units when M=2 and N=2. FIG. 4B is a drawing illustrating the outputs of the interleaving units. The conditions for shuffling are the same as described with reference to FIG. 3A and FIG. 3B.

In the distributing unit 11, the outputs from the error correcting encoders 1-1 and 1-2 are written alternately between the interleaving units 12-1 and 12-2, one bit each from the error correcting encoders 1-1 and 1-2 for the interleaving unit 12-1, and two bits each from the error correcting encoders 1-1 and 1-2 for the interleaving unit 12-2. This process is carried out until all the three rows are filled in the interleaving unit 12-1, and all the six rows are filled in the interleaving unit 12-2. Thus, bits from the error correcting encoders 1-1 and 1-2 are shuffled in a different way than that shown with reference to FIG. 3A and FIG. 3B.

In the present embodiment, the first communication channel and the second communication channel are assumed to have the same number of transmission symbols. However, the number of transmission symbols in the two communication channels may be different. Further, the distribution of the bits to the interleaving units may not be equal. Moreover, any distribution method may be used, as long as the bits that are written to the interleaving units are reasonably shuffled.

Thus, in the present embodiment, a data series in the form of an output of a single error correcting encoder is transmitted by distributing the output to a plurality of frequency-division communication channels. Consequently, even if one communication channel is unable to communicate independently due to a sudden major interference, or the like, the errors are widely scattered due to the trans-communication channel interleaving and deinterleaving, and the error correcting decoders are able to carry out error correction. As a result, throughput is not adversely affected. Because the interleaver 2 consists of the distributing unit 11 and the interleaving units 12-1 through 12-N, the conventional interleaver, which is modulation method-specific, may also be adaptable.

Figure 5:
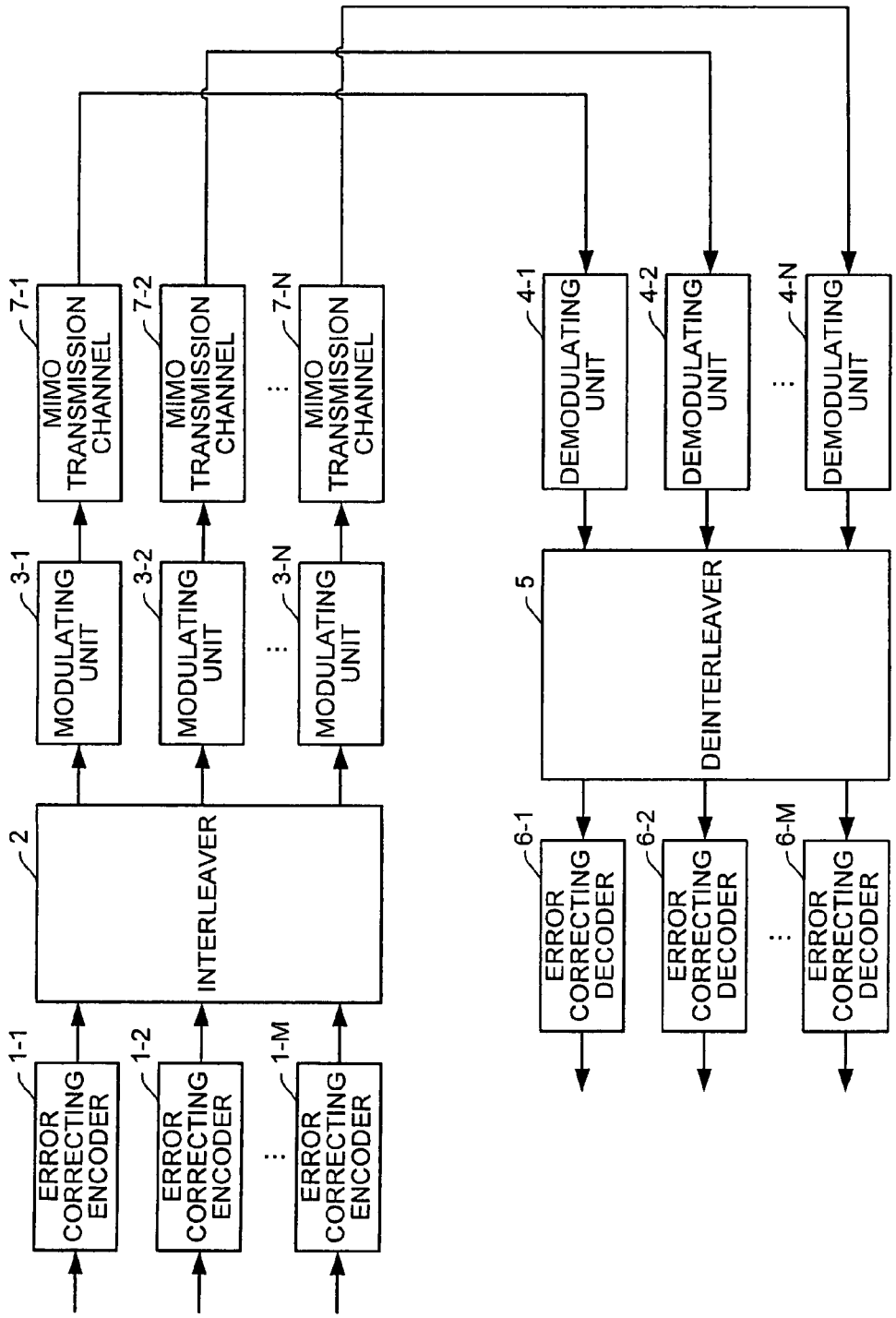
FIG. 5 is a drawing of a configuration of a communication system in which the communication device shown in FIG. 1 uses MIMO communication channels.

The communication in the communication device according to the present invention is explained with reference to a plurality of frequency-division communication channels. However, the present invention is not limited thereto, and a plurality of space-division communication channels (Multiple-Input Multiple-Output (MIMO) communication channels, corresponding to communication channels 7-1, 7-2, and so on through 7-N shown in FIG. 5) may also be used. FIG. 5 is a drawing of a configuration of a communication system in which the communication device shown in FIG. 1 uses MIMO communication channels. Thus, if the shuffling method according to the present embodiment is deployed, the effect described earlier can be achieved even with MIMO communication channels. The MIMO communication channels may be realized by a plurality of antennae, or by beam forming, as long as they use space-division.

Further, in the present embodiment, the same effect described earlier can be achieved by using a plurality of both frequency-division communication channels and time-division communication channels (MIMO communication channels) for communication.

Figure 6A:
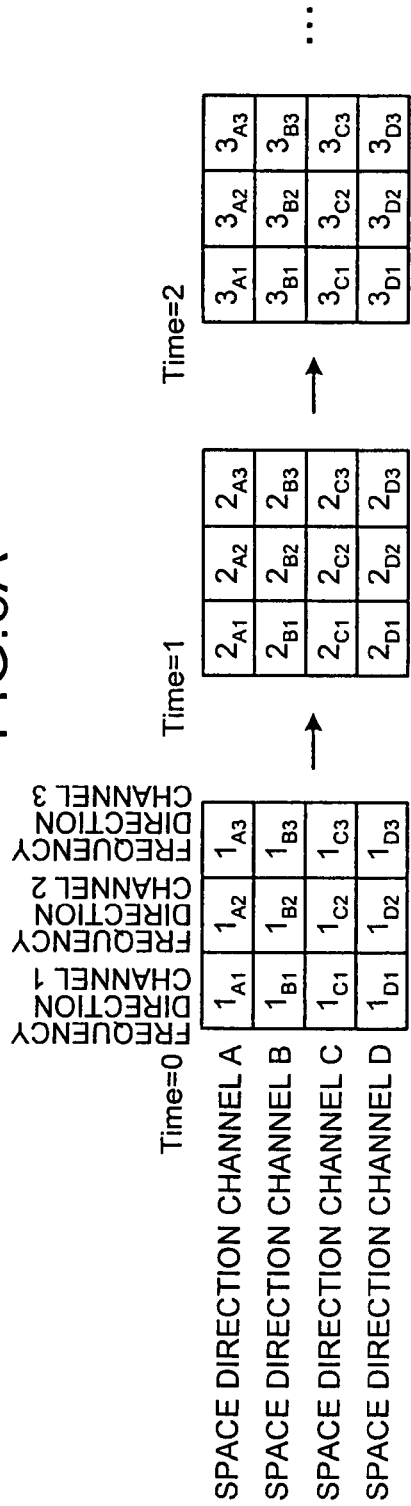
FIG. 6A and FIG. 6B are drawings illustrating yet another example of the shuffling method.
Figure 6B:
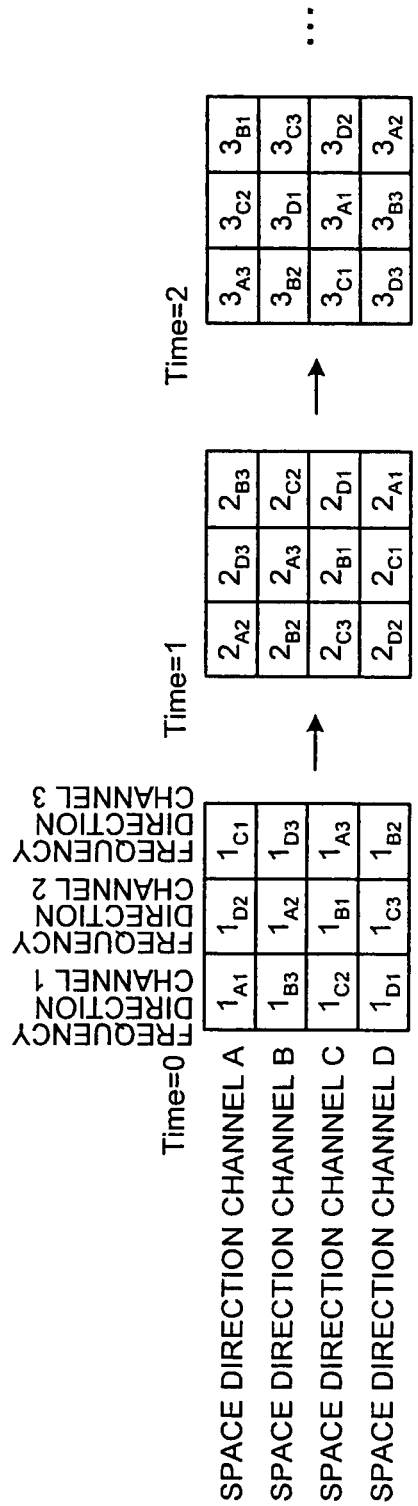

FIG. 6A and FIG. 6B are drawings illustrating yet another example of the shuffling method of the interleaver 2 according to the present embodiment. To be specific, FIG. 6A and FIG. 6B are drawings illustrating shuffling in frequency direction and space direction.

FIG. 6A is a drawing illustrating an output sequence when no shuffling is carried out by the interleaver. FIG. 6B is a drawing illustrating the output sequence after the interleaver performs interleaving. In this example, the communication channel is assumed to have four rows in the space direction and three columns in the frequency direction. However, there may be greater or fewer rows and columns.

In the shuffling method explained with reference to FIG. 6A and FIG. 6B, the conventional time-direction interleaving unit may be jointly used either by connecting it in the beginning or at the end.

Figure 7:
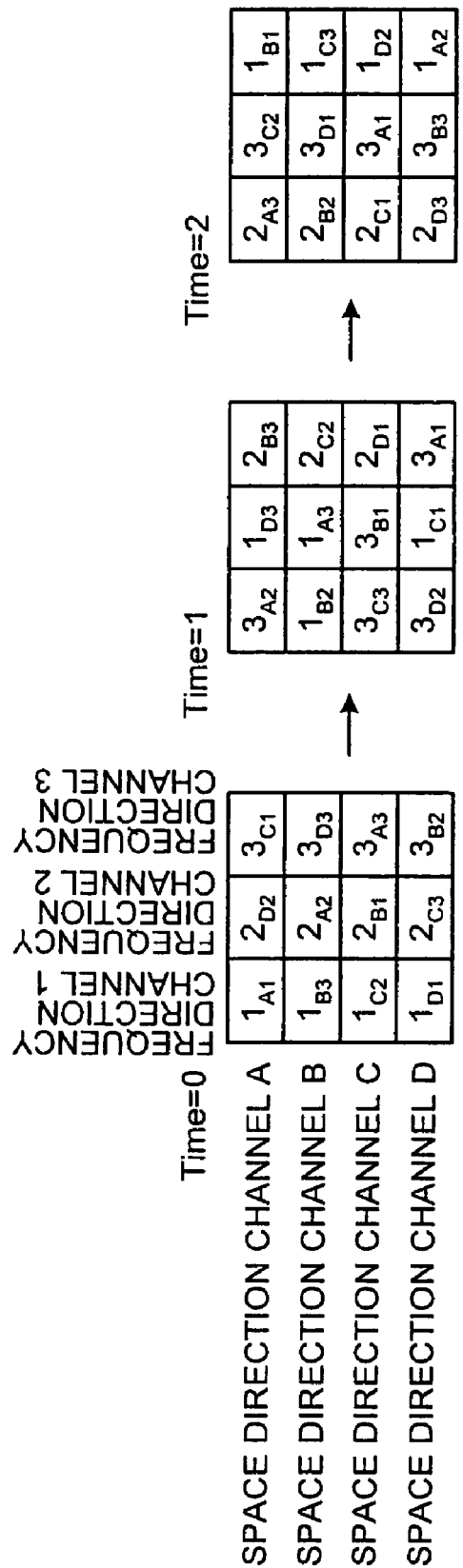
FIG. 7 is a drawing illustrating yet another example of the shuffling method.

FIG. 7 is a drawing illustrating yet another example of the shuffling method of the interleaver 2 according to the present invention. To be specific, FIG. 7 is a drawing illustrating an output order of the data prior to interleaving shown in FIG. 6A, after it is shuffled in frequency direction, space direction, and time direction. In this example, the communication channel is assumed to have four rows in the space direction and three columns in the frequency direction. However, there may be greater or fewer rows and columns.

The interleaver described in the claims is essentially equivalent to the interleaver 2 described in the present embodiment, and a plurality of inter-communication channel interleaving units described in the claims are essentially equivalent to both the interleaver described in the claims and the interleaver 2.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An interleaver, provided in a communication device that carries out communication using N number of communication channels, N being an integer not less than 2, comprising:
    a trans-communication channel interleaving unit that receives an original data series to be transmitted over the N communication channels and carries out a shuffling process on the original data series, thereby producing a shuffled data series, wherein
    the shuffling process includes shuffling the original data three-dimensionally in a time direction, a space-divided communication channel direction, and a frequency-divided communication channel direction, wherein the trans-communication channel interleaving unit includes
    a distributing unit that distributes the original data series to the communication channels by a predetermined method; and
    N number of interleaving units, corresponding to the N communication channels, that carry out the shuffling process according to a modulation method of the corresponding communication channel.

2. A deinterleaver, provided in a communication device that carries out communication using N number of communication channels, N being an integer not less than 2, comprising:
    a trans-communication channel deinterleaving unit that receives a shuffled data series and carries out a second shuffling process on the shuffled data series, to regenerate an original data series, wherein
    the original data series is meant to be transmitted over the N communication channels, the shuffled data series is generated by a first shuffling process, which is carried out by a communication device on a transmitting end, and which includes shuffling the original data series three-dimensionally in a time direction, a space-divided communication channel direction, and a frequency-divided communication channel direction, and
    the second shuffling process is a reverse of the first shuffling process, and
    wherein the trans-communication channel deinterleaving unit includes N number of deinterleaving units, corresponding to the N communication channels, that carry out the second shuffling process according to a modulation method of the corresponding communication channel.

* * * * *